United States Patent [19]
Yokosuka et al.

[11] Patent Number: 5,720,849
[45] Date of Patent: Feb. 24, 1998

[54] WAFER MOUNTING DEVICE

[75] Inventors: Noriyoshi Yokosuka, Iruma; Shizuo Suzuki, Oume, both of Japan

[73] Assignee: Enya Systems, Limited, Japan

[21] Appl. No.: 904,439

[22] Filed: Jun. 25, 1992

[30] Foreign Application Priority Data

Jun. 26, 1991 [JP] Japan .................... 3-056783

[51] Int. Cl.$^6$ ........................................ B65C 9/08
[52] U.S. Cl. .................. 156/571; 156/556; 156/583.1; 100/259; 100/265; 269/21
[58] Field of Search .......................... 156/556, 571, 156/583.1, 359; 269/21; 100/259, 265, 207

[56] References Cited

U.S. PATENT DOCUMENTS

| | | | |
|---|---|---|---|
| 4,540,460 | 9/1985 | Blomquist et al. | 156/571 |
| 4,960,485 | 10/1990 | Ichinose et al. | 156/556 |
| 4,966,639 | 10/1990 | Pfeffer et al. | 156/359 |
| 4,980,002 | 12/1990 | Dzarnoski, Jr. et al. | 156/556 |

Primary Examiner—David A. Simmons
Assistant Examiner—Paul M. Rivard
Attorney, Agent, or Firm—Adams & Wilks

[57] ABSTRACT

A wafer mounting device transfers a wafer coated with an adhesive and pastes the wafer on a mount plate while maintaining the thickness of the adhesive uniform. A chuck plate is carried by a rotatable transfer arm and holds the adhesive-coated wafer by suction so that the wafer can be moved in a direction of rotation of the arm. The chuck plate is heated by a heater to substantially the same temperature as the wafer. A flexible pressing pad is disposed between the chuck plate and the transfer arm for biasing the chuck plate in a direction away from the arm, and a flexible pressure-adjusting pad is provided for biasing the chuck plate in a direction toward the arm. The pressing pad and the pressure-adjusting pad have hollow sections filled with pressurized fluid, and the pressure of the fluid within each pad is regulated to thereby control the pressing force of the chuck plate so that the wafer is placed softly on the mount plate.

18 Claims, 3 Drawing Sheets

WAFER MOUNTING DEVICE

FIELD OF THE INVENTION (1) Field of the Invention

The present invention relates to a wafer mounting device in which a wafer is pasted uniformly upon a mount plate which supports the wafer while it is being polished.

(2) Background Information

In the fabrication of semiconductors, semiconductor wafers are pasted with an adhesive upon a mount plate of a polishing machine which polishes the surfaces of the wafers. If the adhesive layer between the wafers and the mount plate is not applied thinly and uniformly, minute unevenness is formed on the wafer surfaces during polishing, and it becomes impossible to polish the wafers flatly with high precision. Further, since the wafer mounting operation is carried out manually, it is difficult to form the adhesive layer evenly and the efficiency of production is not good.

U.S. Pat. No. 4,960,485 describes a process wherein an adhesive diluted with an organic solvent or an aqueous alkali solution is applied thinly on the surface of a wafer by means of a spin coater, and the wafer is then reversed and pasted on a mount plate.

FIG. 6 shows the basic structure of the process described in the aforesaid U.S. Pat. No. 4,960,485, wherein a semiconductor wafer 1 is placed horizontally on a conveying means 4 by vertically moving a holding section 3 of a receiving device 2, and the wafer 1 is conveyed above a spin chuck means 5 by laterally moving the conveying means 4. A holding section 6 of the spin chuck means 5 moves up and carries the wafer 1 into an adhesive coating device 7, where the wafer spins around and the adhesive is dropped from a nozzle 8 to apply it thinly on the surface of the wafer. The adhesive-coated wafer 1 is then placed on the conveying means 4 by moving down the holding section 6 of the spin chuck means 5.

The conveying means 4 which has received the adhesive-coated wafer 1 is laterally moved to the position shown by chain lines, where a wafer mounting device 9 is disposed. The wafer mounting device 9 has a chuck plate 11 at the end of an arm 10. When the arm 10 is turned as shown by an arrow 12, it holds by suction the wafer 1 and places the wafer on the upper surface of a mount plate 13. The mount plate 13 has been previously heated to a predetermined temperature, and a heating means 14 is disposed around the mount plate to accelerate the evaporation of the organic solvent or the aqueous alkali solution in the adhesive to solidify and fix the adhesive.

Above the mount plate 13, a stamp means 15 is disposed to press the wafer 1 against the mount plate 13. Then, the mount plate 13 is rotated by a predetermined angle by use of an indexing means 16 to paste the wafers sequentially thereon. After a plurality of wafers are pasted on the mount plate 13, the mount plate is conveyed to the following work station where the mount plate is cooled together with the plural wafers to solidify the adhesive completely.

In the process of mounting the wafers, since the adhesive is applied by spin coating, the adhesive is heated to an adequate temperature and has a certain fluidity. Therefore, when the chuck plate 11 of the wafer mounting device holds the wafer 1 by suction, if the temperature of the chuck plate 11 is low compared with that of the wafer 1 coated with the adhesive, the fluidity of the adhesive at the portion 17 thereof which overlies the chuck plate 11 as shown in FIG. 7 tends to be poor, and thus it becomes impossible to form an even adhesive layer of uniform thickness on the whole surface of the wafer.

Further, when the wafer 1 is held by suction by the chuck plate 11, and the wafer is pasted on the mount plate 13 by turning the arm 10, if the force of the chuck plate 11 to press the wafer 1 against the mount plate is too strong, the thickness of the adhesive layer at the portion of the wafer pressed directly by the chuck plate and the thickness of the adhesive layer at the peripheral portion of the wafer become different.

SUMMARY OF THE INVENTION

An object of the present invention is to provide a wafer mounting device by which a wafer can be pasted on a mount plate without causing the thickness of an adhesive layer applied on the wafer to become uneven.

Another object of the present invention is to provide a wafer mounting device wherein the thickness of the adhesive layer can be evenly maintained by finely adjusting the pressing force used to paste the wafer on the mount plate.

According to the present invention, the above and other objects can be accomplished by a wafer mounting device comprising a heater for heating the chuck plate which holds the wafer to substantially the same temperature as the temperature of the wafer.

Further, according to the present invention, the above and other objects can be accomplished by a wafer mounting device which comprises a movable transfer arm, a chuck plate disposed at the end of the arm such that the chuck plate can be moved in a direction of rotation of the arm, a pressing pad for urging the chuck plate in a direction away from the arm, and a pressure-adjusting pad for urging the chuck plate in a direction toward the arm, whereby the pressing force of the chuck plate can be adjusted.

Other objects, features and advantages of the present invention will become apparent to those skilled in the art upon a reading of the following description with reference to the accompanying drawings.

DESCRIPTION OF THE PREFERRED EMBODIMENTS

Figure 1:
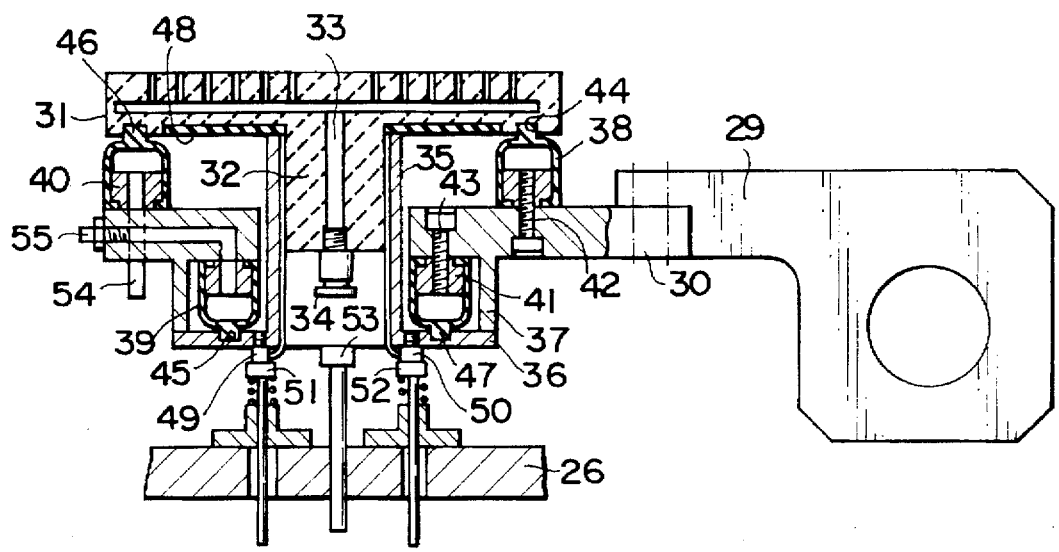
FIG. 1 is an enlarged cross-sectional view of a part of an arm of a wafer mounting device according to the present invention.
Figure 2:
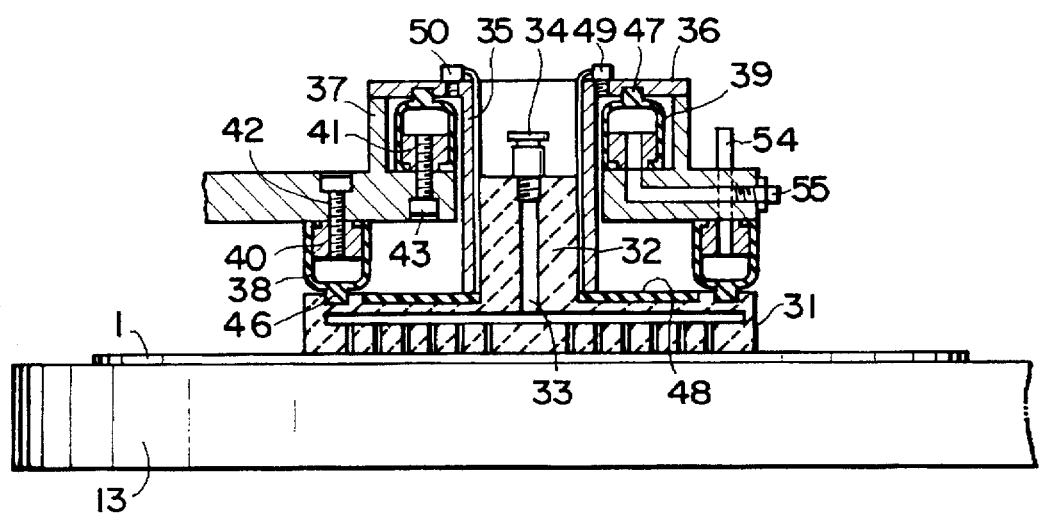
FIG. 2 is an enlarged cross-sectional view of a part of the arm under the condition that the wafer is reversed and pasted on a mount plate.
Figure 3:
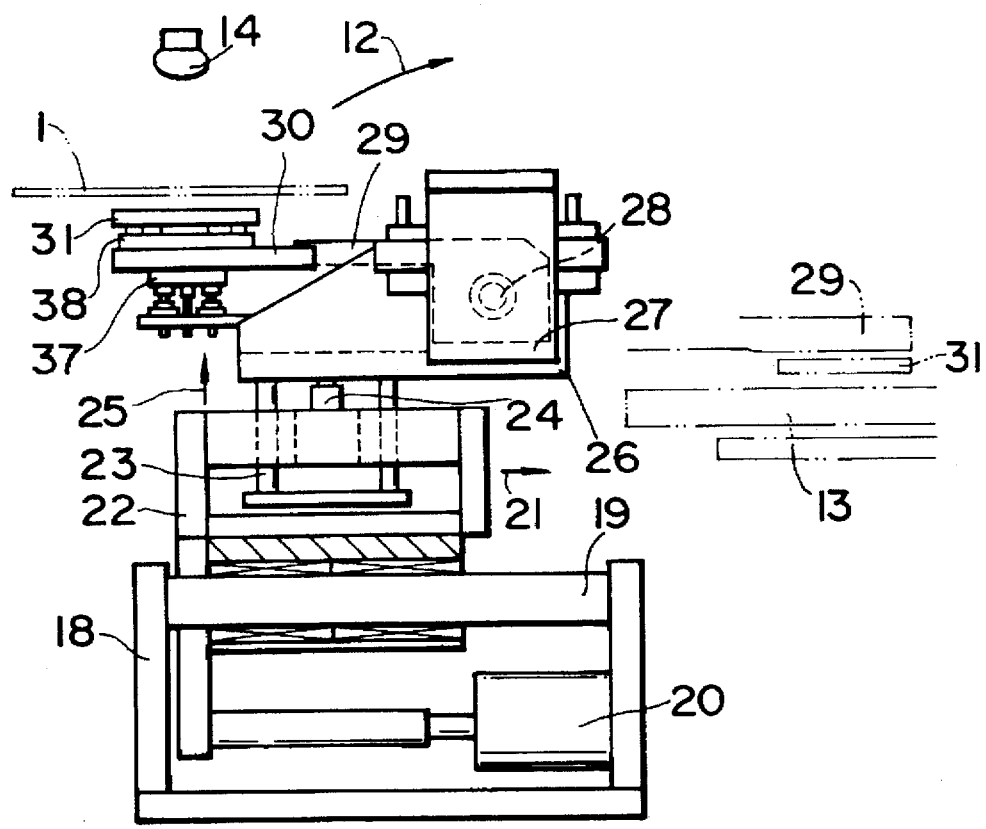
FIG. 3 is a side view of a wafer mounting device according to the present invention.

One embodiment of a wafer mounting device according to the present invention is shown in FIG. 3 and the details of the transfer arm and chuck plate are shown in FIGS. 1 and 2. The wafer mounting device has a main body 18 provided with a movable frame 22, which is guided by a guide rod 19 and moved in a direction of an arrow 21 by a cylinder 20, and a movable frame 26, which is mounted on the frame 22 and which is guided by a guide rod 23 and moved in a direction of an arrow 25 by a cylinder 24. The movable frame 26 is provided with a transfer arm 29 pivotally mounted by a pivot shaft 28 so as to rotate by means of a rotating means 27, such as a motor or an air actuator. The entire body 18 of the device may be moved up or down.

The wafer mounting device is disposed along the path of advancement of the semiconductor wafers to individually transfer the wafers, after they have been coated with adhesive, to a mount plate which supports the wafers during the polishing thereof to smoothen the wafer surfaces. In this embodiment, the movable frame 22 moves in the upward and downward directions and the movable frame 26 moves in the leftward and rightward directions. The frames 22,26 may be mounted to move in other directions to suitably position the transfer arm 29, or structure other than the frames may be used to position the transfer arm.

The distal end of the transfer arm 29 terminates in a mounting plate 30, which is detachably connected to the arm 29. In this embodiment, the plate 30 is provided with a chuck means. However, the chuck means may be attached directly to the arm 29 without provision of the mounting plate 30. The chuck means may have various structures. In this embodiment, the chuck means comprises a chuck plate 31 made of heat-conductive material, such as ceramic material, a shaft 32 connected to the chuck plate 31 and having a through-hole 33 extending therethrough to apply suction by vacuum at the front surface of the chuck plate 31, and a connecting pipe 34 which connects the through-hole 33 to a vacuum source through suitable valving (not shown).

The shaft 32 of the chuck plate 31 is fixed to a supporting cylinder 35 which is slidably mounted in an opening in the mounting plate 30. A support plate 36 is connected to the end of the supporting cylinder 35 opposite to the chuck plate 31, and the mounting plate 30 has a protruding wall 37 formed to abut the support plate 36. By such an arrangement, the chuck plate 31 is mounted to undergo displacement in a direction of rotation of the transfer arm 29.

A hollow, flexible pressing pad 38 is disposed between the plate 31 of the chuck means and the mounting plate 30 of the arm 29, and a hollow, flexible pressure-adjusting pad 39 is disposed between the support plate 36 and the mounting plate 30. The flexible pads 38,39 are made of an elastic material having a good heat-resistant property, such as a silicone rubber material. The pads 38,39 have an annular shape and have a cross section of a substantially C-shape. Holding plates 40,41 are each inserted through openings formed at the base of the pads 38,39. The lower edges of the pads are clamped between the mounting plate 30 and the holding plates 40,41 and are fixed by bolts 42,43 to the mounting plate 30. On the upper surface of the pads 38,39 are provided engaging projections 46,47, which are inserted into engaging slots 44,45 formed on the chuck plate 31 and the support plate 36, respectively, so as to prevent lateral displacement of the pads.

The chuck plate 31 is provided with a heater 48 for heating the chuck plate to substantially the same temperature as that of the wafer 1. The heater 48 used in this embodiment comprises a rubber heater attached to the back surface of the chuck plate 31. The rubber heater is a resistance heater comprised of electrical heat-generating resistors embedded in silicone rubber. In order to heat the chuck plate 31 evenly, the rubber heater is fixed directly to the back side of the ceramic chuck plate using a silicone adhesive. Instead of embedding the resistance heater in rubber, it may be pattern-printed directly on the back of the chuck plate or on a resistance plate attached to the chuck plate. The heater 48 is connected by wiring to terminals 49,50 attached to the support plate 36.

As shown in FIG. 1, the movable frame 26 is provided with terminals 51,52 which are connected to an electric power source (not shown) and resiliently mounted by springs. The terminals 51,52 are positioned to be electrically connected to the terminals 49,50 of the support plate 36 to apply electric current to the heater 48 when the transfer arm 29 is in the condition shown in FIG. 1. The temperature of the chuck plate 31 is detected by a temperature sensor 53, and means (not shown) is provided for controlling the electric current to the heater 48 by the detection signals.

The heater 48 used in this embodiment is directly attached to the chuck plate 31, but it may be disposed adjacent to the chuck plate. The advantage of fixing the heater 48 directly to the back side of the chuck plate 31 is that heat energy can be efficiently transferred by conduction through the heat-conductive chuck plate to the wafer 1 to maintain the wafer at a substantially uniform or even temperature. Alternatively, the chuck plate 31 may be heated by other appropriate heating means.

Pressurizing means are provided to introduce a pressurized fluid into the flexible pads 38,39 and maintain the pressure within each of the pads at a predetermined pressure. The pressurizing means comprises a fluid circuit for supplying a pressurized fluid, such as nitrogen gas or air, from a pressurized fluid supply source (not shown). The pressurized fluid is adjusted to a pressure of about 0.01 to 1 kg/cm$^2$ by means of a precision pressure regulator or the like and is supplied to the pad 38 through a conduit 54 and to the pad 39 through a conduit 55. For convenience, the conduits 54 and 55 are formed in the mounting plate 30, but they may be formed externally of the mounting plate.

The pressure exerted by the pressure-adjusting pad 39 is controlled by regulating the pressure of the pressurized fluid supplied thereto so as to control the force at which the chuck plate 31 presses the wafer 1 against a mount plate 13, as shown in FIG. 2, by the pressing pad 38. The pressure of the pressurized fluid supplied to the pressure-adjusting pad 39 is preferably regulated independently of that of the pressurized fluid supplied to the pressing pad 38, and this enables precise regulation of the pressing force at which the chuck plate 31 presses the wafer 1 against the mount plate 13.

The fluid circuit is provided with a digital pressure switch (not shown) so as to detect a reduction of the pressure when, for example, one of the pads 38,39 ruptures or leaks or one of the fluid conduits of the fluid circuit becomes detached, thereby resulting in a sharp reduction of the inner pressure of the pads. The pressure switch outputs a signal to stop the introduction of the pressurized fluid and, at the same time, to stop the operation of the entire apparatus shown in FIG. 6.

In the case where the wafer mounting device is used in a clean or ultra clean environment which can tolerate only a limited number of dust particles, the fluid circuit may have a dust counter (not shown) for counting dust particles in the surrounding region. After the dust counter counts a predetermined number of dust particles, a solenoid valve (not shown) placed at a suitable location in the fluid circuit is energized to stop the supply of the pressurized fluid and to stop the operation of the wafer mounting device.

Figure 6:
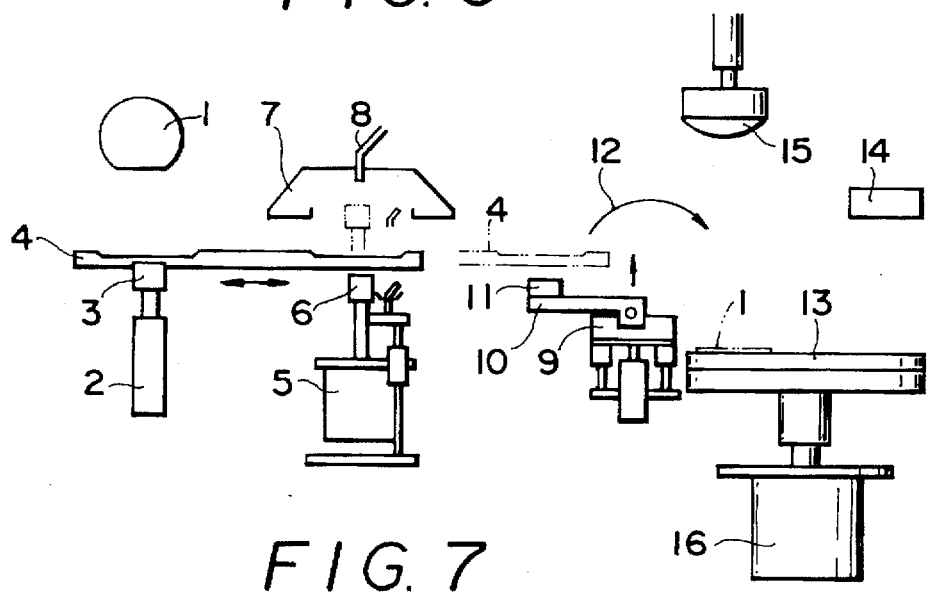
FIG. 6 is an explanatory view showing the sequence of automatically mounting a wafer using the wafer mounting device of the present invention.
Figure 7:
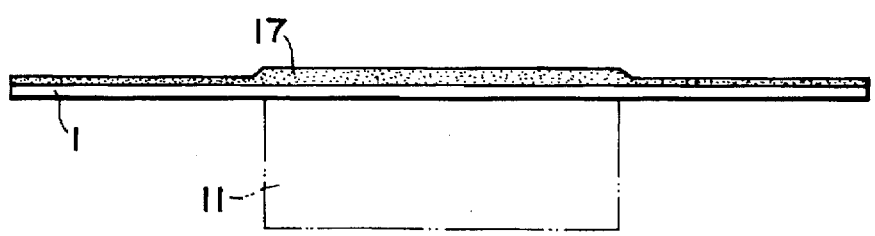
FIG. 7 is an enlarged side view of a wafer held by a chuck plate in a prior art wafer mounting device.

In operation, as shown in FIG. 3, when the transfer arm 29 of the wafer mounting device is displaced upwardly in the direction of the arrow 25, the wafer 1 which has been coated with adhesive on the upper surface thereof is releasably held by suction by the chuck means 31–36, turned upside down and inverted 180° by turning the arm 29 in a direction of an arrow 12 as shown in FIG. 6, and placed on the mount plate 13 as shown in FIG. 2. During this time, the chuck plate 31 is heated to substantially the same temperature as the wafer 1 by the heater 48. In this manner, no temperature difference exists between the portion of the wafer held by suction by the chuck plate 31 and the other portions of the wafer, whereby the fluidity of the adhesive remains substantially uniform and the thickness of the adhesive layer remains level and does not become uneven.

Further, as shown in FIG. 2, when the wafer 1 is transferred onto the mount plate 13 by turning the transfer arm 29, the chuck plate 31 is urged downwardly by the pressing pad 38 and is urged upwardly by the pressure-adjusting pad 39. By separately adjusting the pressures of the pressurized fluid applied to the pads 38,39, the movement of the chuck plate 31 can be precisely controlled so as to place the wafer 1 on the mounting plate 13 softly. By such control, it is possible to prevent unevenness of the thickness of the adhesive layer due to the downward pressure exerted by the chuck plate 31.

In the above embodiment, the mounting plate 30 disposed at the end of the transfer arm 29 can be easily detached and exchanged with other ones depending upon the sizes of the wafers. Further, when the body 18 of the wafer mounting device is not positioned horizontally relative to the mounting plate 13, an adjustment plate may be rotatably connected to the transfer arm 29 so as to adjust the position.

Figure 4:
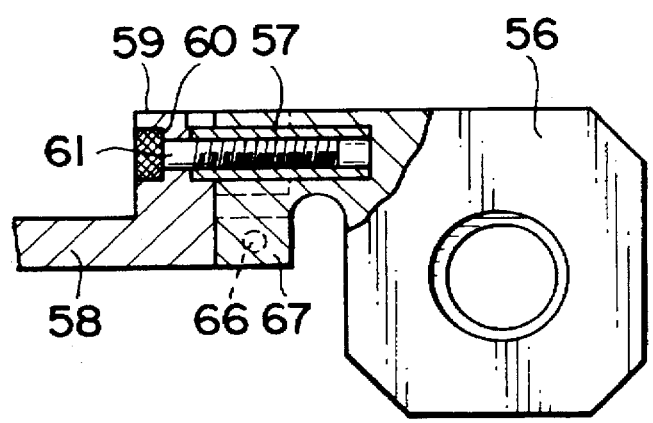
FIG. 4 is a partially cross-sectional view of another embodiment of an arm of a wafer mounting device according to the present invention.
Figure 5:
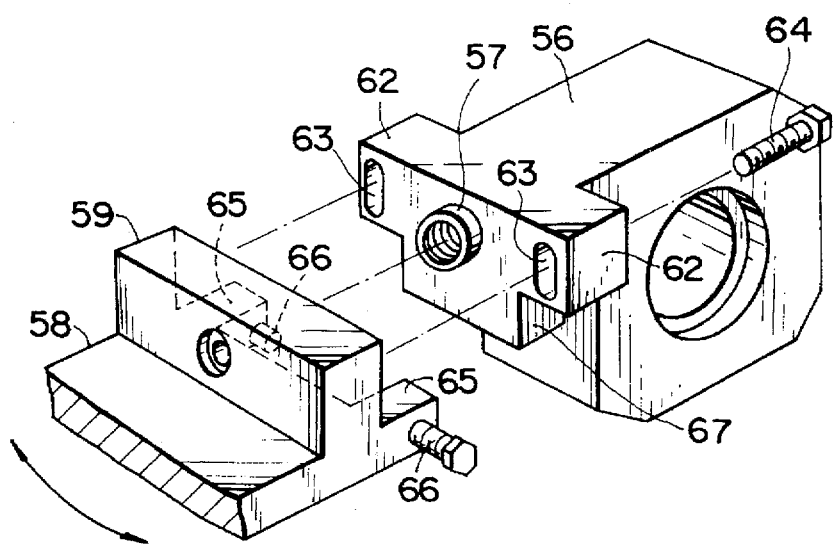
FIG. 5 is an exploded perspective view of the arm shown in FIG. 4.

FIGS. 4 and 5 show a modified embodiment of transfer arm wherein a guide cylinder 57 is fixed to the top of a transfer arm 56. A slot 60 is formed in a rising wall 59 of a mounting plate 58, and the guide cylinder 57 is rotatably disposed in the slot 60 in such a manner that the mounting plate 58 can be freely rotated to adjust the angular position of the mounting plate 58 relative to the remainder of the transfer arm 56. A bolt 61 is provided to fix the mounting plate 58 in the desired adjusted position.

At wing sections 62,62 of the arm 56, elongated slots 63,63 are formed. A bolt 64 is inserted through each of the elongated slots 63,63 in such a manner as to be freely movable, and the bolts 64,64 are screwed into the rising wall 59 of the mounting plate 58, whereupon the inclination or slant of the mounting plate 58 can be adjusted as described below, and the mounting plate 58 and the arm 56 can be fastened at a predetermined position. A pair of lug sections 65,65 project from the rising wall 59, and adjusting bolts 66,66 are screwed into the sides of the lug sections from opposite directions. The ends of the bolts 66,66 abut with opposed side surfaces of a vertical wall 67 of the arm 56.

By the above structure, the chuck plate 31 carried by the transfer arm 56 can be rotated around the longitudinal axis of the arm by simply changing the extent to which the bolts 66,66 are screwed into the lug sections 65,65. For example, by tightening one bolt and loosening the other, the mounting plate 58 can be rotated in one direction with the guide cylinder 57 as a center and the mounting angle of the chuck plate 31 relative to the transfer arm 56 can be changed. Similarly, by loosening the one bolt and tightening the other, the mounting plate can be rotated in the opposite direction. By such a construction, the chuck plate 31 can be disposed in a precise horizontal condition against the mounting plate 13.

According to the present invention, the wafers can be pasted on the mounting plate in a controlled manner so that the thickness of the adhesive layer applied on the wafers is maintained uniform and not made uneven.

We claim:

1. A wafer mounting device for mounting a wafer coated with an adhesive on a mount plate, comprising: a rotatable arm; a chuck plate disposed at an end of the arm to hold a wafer by suction on a front side of the chuck plate; a pressing pad disposed between the chuck plate and the arm for resiliently urging the chuck plate in a direction away from the arm, the pressing pad comprising a hollow flexible member receptive of a pressurized fluid for exerting a force on the chuck plate proportional to the pressure of the pressurized fluid supplied to the pressing pad; a support plate connected to the chuck plate with the arm in between; a pressure-adjusting pad disposed between the support plate and the arm for resiliently urging the chuck plate in a direction toward the arm, the pressure-adjusting pad comprising a hollow flexible member receptive of a pressurized fluid for exerting a force on the chuck plate proportional to the pressure of the pressurized fluid supplied to the pressure-adjusting pad; and a heater for heating the chuck plate to substantially the same temperature as that of the wafer.

2. A wafer mounting device according to claim 1; wherein the heater is connected to the back side of the chuck plate.

3. A wafer mounting device according to claim 1; including means turnably mounting the chuck plate for turning movement about the axis of the arm.

4. A device for mounting an adhesive-coated wafer on a mount plate, comprising: a movable transfer arm; holding means carried by the transfer arm for releasably holding a wafer coated on one side with an adhesive which is in a fluid state; means movably mounting the transfer arm to transfer the adhesive-coated wafer held by the holding means from a first position in which the adhesive-coated wafer is spaced from a mount plate to a second position in which the adhesive-coated wafer is mounted on the mount plate; heating means for heating the holding means to substantially the same temperature as that of the adhesive-coated wafer so as to maintain the fluidity of the adhesive substantially uniform while the adhesive-coated wafer is held by the holding means; means movably mounting the holding means on the transfer arm to undergo movement toward and away from the transfer arm; first means for resiliently urging the holding means away from the transfer arm; and second means for resiliently urging the holding means toward the transfer arm.

5. A device according to claim 4; wherein the heating means is carried by the holding means.

6. A device according to claim 5; wherein the holding means has a heat-conductive portion which abuts the wafer during holding of the wafer; and the heating means comprises means for heating the heat-conductive portion of the holding means to thereby transfer heat by conduction through the holding means to the wafer.

7. A device according to claim 6; wherein the holding means comprises a chuck plate having means for holding the wafer by suction against a surface of the chuck plate, the chuck plate being composed of heat-conductive material.

8. A device according to claim 4; wherein the first and second means comprise flexible pads for receiving pressurized fluid.

9. A device according to claim 4; wherein the holding means comprises a shaft slidable in an opening in the transfer arm, a chuck plate connected to one end of the shaft on one side of the transfer arm for holding the wafer by suction, and a support plate connected to the other end of the shaft on the other side of the transfer arm; the first means is disposed between the transfer arm and the chuck plate for urging the chuck plate away from the transfer arm; and the second means is disposed between the transfer arm and the support plate for urging the chuck plate toward the transfer arm.

10. A device according to claim 9; wherein the first and second means comprise flexible pads, means for supplying pressurized fluid to the flexible pad of the first means, and means for supplying pressurized fluid to the flexible pad of the second means.

11. A device according to claim 10; wherein the means for supplying pressurized fluid to the flexible pads comprise fluid conduits within the transfer arm for communicating the interiors of the flexible pads with a source of pressurized fluid.

12. A device according to claim 9; wherein the heating means is carried by the holding means.

13. A device according to claim 12; wherein the chuck plate is composed of heat-conductive material; and the heating means comprises means for heating the chuck plate to transfer heat by conduction through the chuck plate to the wafer.

14. A device according to claim 13; wherein the heating means comprises a resistance heater mounted on a back side of the chuck plate opposite to the front side which holds the wafer.

15. A device according to claim 13; wherein the heat-conductive material comprises ceramic.

16. A wafer mounting device according to claim 1; including sensing means for sensing the temperature of the chuck plate to control the heating thereof by the heater.

17. A device according to claim 4; including sensing means for sensing the temperature of the holding means to control the heating thereof by the heating means.

18. A device according to claim 4; wherein the heating means comprises electrically energizeable heating means responsive to electric power applied thereto for heating the holding means; and means including terminals carried by the holding means engageable with terminals connectable to an electric power source for applying electric power to the heating means.

* * * * *